United States Patent [19]

Hammond et al.

[11] Patent Number: 4,694,779

[45] Date of Patent: Sep. 22, 1987

[54] REACTOR APPARATUS FOR SEMICONDUCTOR WAFER PROCESSING

[75] Inventors: Martin L. Hammond, Cupertino; Charles L. Ramiller, Santa Clara, both of Calif.

[73] Assignee: Tetron, Inc., Fremont, Calif.

[21] Appl. No.: 662,879

[22] Filed: Oct. 19, 1984

[51] Int. Cl.$^4$ .............................................. C23C 13/08
[52] U.S. Cl. .................................. 118/730; 118/728; 118/729; 118/500; 156/345; 156/643
[58] Field of Search ............... 118/728, 729, 730, 500; 156/345, 643

[56] References Cited

U.S. PATENT DOCUMENTS

| | | | |
|---|---|---|---|
| 3,365,336 | 1/1968 | Folkmann et al. | 118/500 X |
| 3,460,510 | 8/1969 | Currin | 118/725 X |
| 3,594,242 | 7/1971 | Burd et al. | 118/500 X |
| 3,696,779 | 10/1972 | Murai et al. | 118/730 X |
| 3,699,298 | 10/1972 | Briody | 118/730 X |
| 3,704,987 | 12/1972 | Arndt et al. | 118/730 X |
| 4,033,287 | 7/1977 | Alexander, Jr. et al. | 118/725 X |
| 4,522,149 | 6/1985 | Garbis et al. | 118/728 X |

FOREIGN PATENT DOCUMENTS

| | | | |
|---|---|---|---|
| 158867 | 12/1979 | Japan | 156/345 |
| 110030 | 8/1980 | Japan | 118/728 |
| 57-7899 | 1/1982 | Japan | . |
| 72330 | 5/1982 | Japan | 156/643 |

OTHER PUBLICATIONS

Pegge, "High–Capacity Narrow Susceptor for Vapor Growth Processes", IBM Technical Disclosure Bulletin, vol. 13, No. 3, Aug. 1970, pp. 804–805.

Primary Examiner—Richard Bueker
Attorney, Agent, or Firm—Townsend & Townsend

[57] ABSTRACT

A basic cell for a carrier of semiconductor wafers to permit high-volume, cold wall chemical vapor deposition, including plasma-enhanced CVD. The basic cell has two surfaces, each bearing a wafer or wafers facing and tapering toward each other. Process gases are passed from the wider gap to the narrower gap between the surfaces. Basic cells may be arranged to form a circular carrier with process gases flowing inward to the center of the carrier for a high volume CVD reactor. The basic cell may also be used for plasma etching reactors.

24 Claims, 13 Drawing Figures

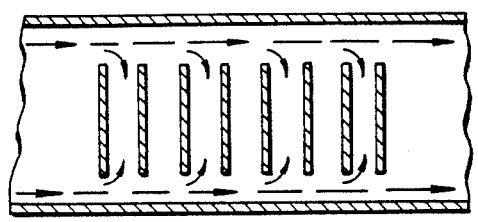
FIG._1A.
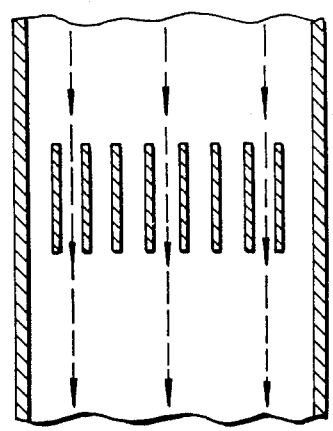
FIG._1B.
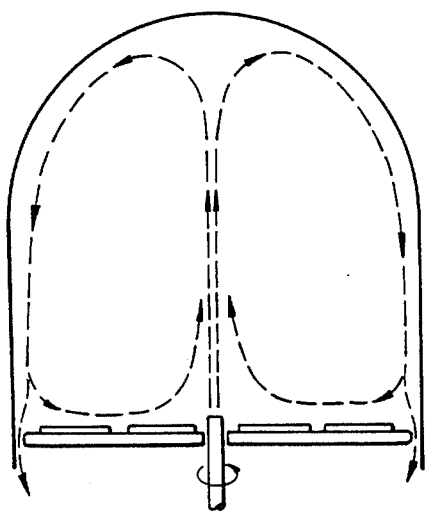
FIG._2A.
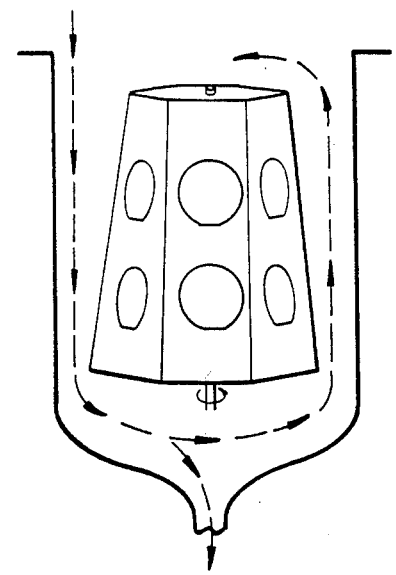
FIG._2C.
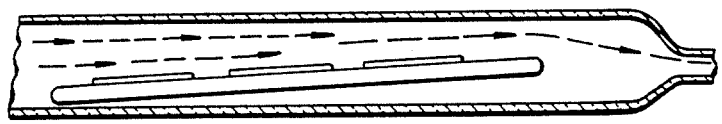
FIG._2B.

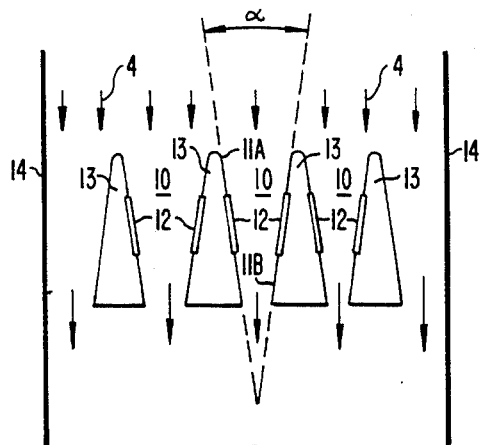
FIG._3A.
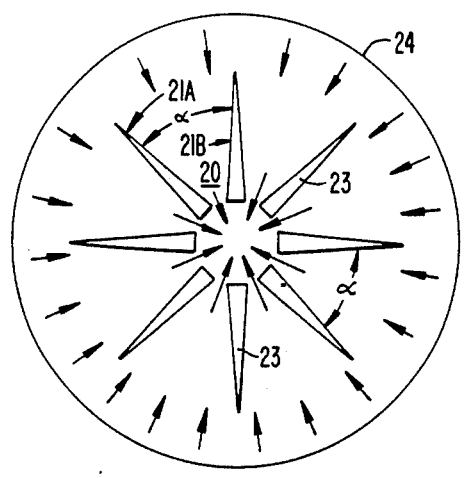
FIG._3C.
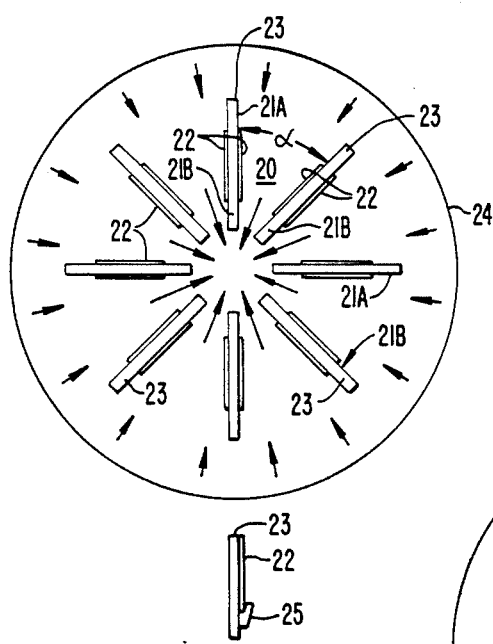
FIG._3B.
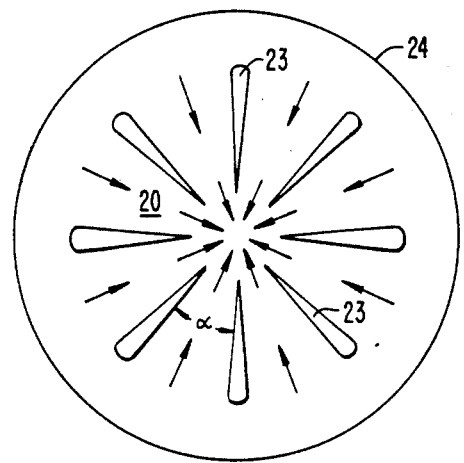
FIG._3D.

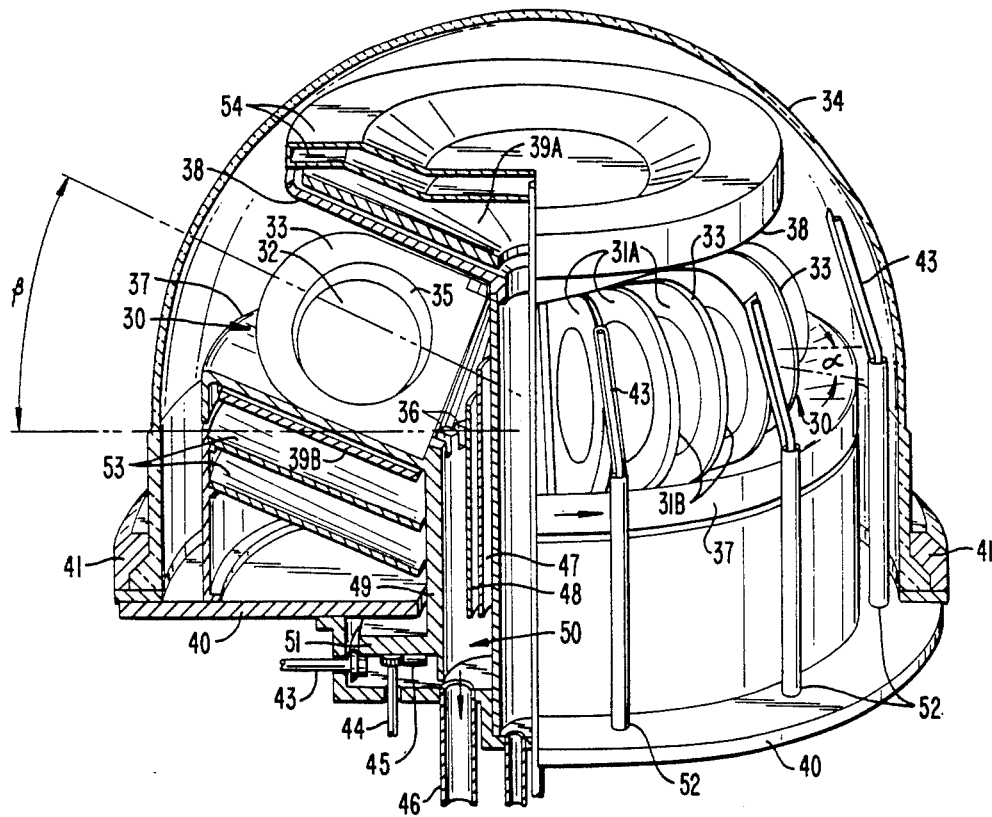
FIG._4.

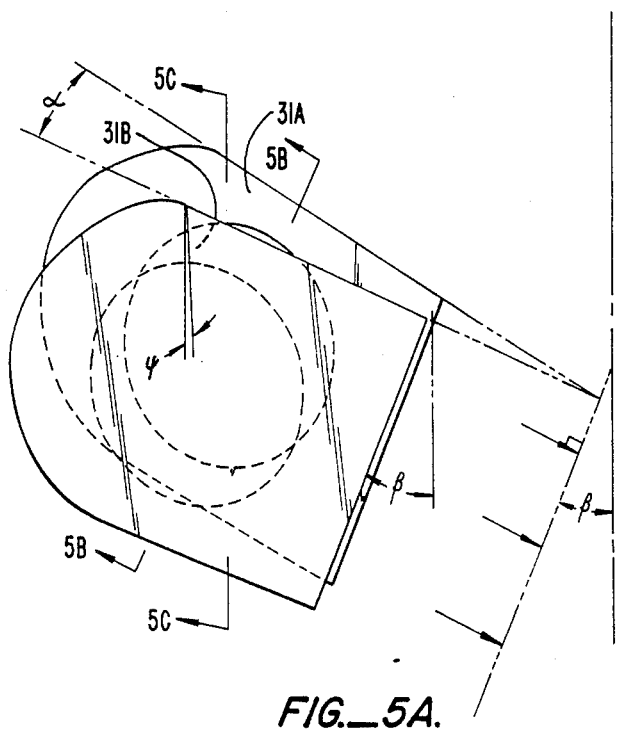
FIG._5A.
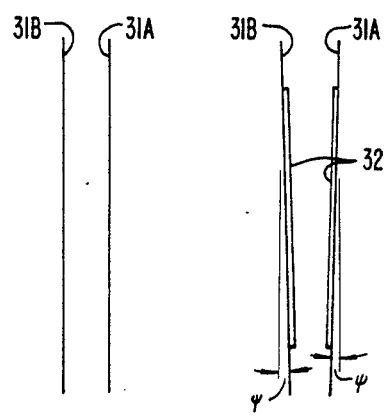
FIG._5B.  FIG._5C.

REACTOR APPARATUS FOR SEMICONDUCTOR WAFER PROCESSING

FIELD OF THE INVENTION

This invention relates to reactors in semiconductor wafer processing technology and, more particularly, to chemical vapor deposition (CVD) reactors, including plasma-enhanced CVD reactors, and to plasma etching reactors.

BACKGROUND OF THE INVENTION

Chemical vapor deposition is a long-practiced technique in the field of semiconductor processing. Basically, chemical vapors, i.e., gases, are passed over heated substrates with which the gases react and deposit material on the wafer. Such material deposits may be polycrystalline (e.g., polycrystalline silicon), amorphous ($SiO_2$, $Si_3N_4$), homo-epitaxial (single crystal silicon deposited on single crystal silicon wafers), or hetero-epitaxial (single crystal silicon deposited upon substrates other than single crystal silicon, such as sapphire.)

In semiconductor processing, it is especially important that the material be deposited uniformly with uniform properties over the wafer. For instance, in integrated circuit technology, especially very large-scale integrated (VSLI) devices, the wafer is separated into chips, each of which is a separate integrated circuit. If a CVD process step does not deposit a uniform layer, each device on a wafer is different from another device and may have different operating characteristics. More likely, these variations generally lead to non-functioning or less than optionally functioning devices.

Wafers are processed in a series of steps. Any step which takes a long time slows manufacturing. Hence another goal of semiconductor manufacturing is to process as many wafers as possible at one time. In a CVD step, it is highly desirable for as many wafers as possible to be loaded into a CVD reactor at a time. Of course, the deposition uniformity requirements of the particular process must be met. Then the wafers can be sent on to the next step in the process.

There are two general classes of CVD reactors. These are the "hot wall" type or the "cold wall" type, depending upon whether the enclosing walls surrounding the deposition area in the reactor is at the same temperature as the deposition area (hot wall) or is colder than the deposition area (cold wall).

Two typical hot wall chemical vapor deposition reactors are shown in FIG. 1. FIG. 1A depicts a side view of a process chamber of a standard low pressure chemical vapor deposition (LPCVD) reactor. An LPCVD reactor with the wafers aligned with the gas flow is illustrated by a side view in FIG. 1B. The wafers in these hot wall reactors stand vertically in boats or carriers conserving space to permit a large number of wafers to be processed at once. The heating furnace is located outside the process chamber. Vacuum pumps and related equipment are not shown.

FIG. 2 depicts three different cold wall reactors. A vertical pancake reactor is shown in FIG. 2A, a horizontal slab reactor is shown in FIG. 2B and a cylinder reactor is shown in FIG. 2C. Typically, the thin flat substrates of the semiconductor wafers are placed on a carrier or susceptor and heated to the desired temperature by induction, high intensity light radiation, electrical resistance, or a combination of such techniques. In all the geometries shown in FIG. 2, the substrates lay flat against the carrier and absorb energy from the carrier and from more remote sources by radiation, conduction and convection.

The reason for the bifurcation of CVD reactors lies in the fact that for processes in which the temperature and deposition thicknesses are comparatively low, the hot wall reactors are superior to the cold wall reactors in terms of uniformity and productivity. On the other hand, when the material must be deposited at comparatively high temperatures, the cold wall CVD reactors have the uniformity, quality and productivity advantage. It should be noted that the cold wall reactors have limited wafer capacity. Unlike the hot wall reactors into which wafers are arranged standing upright, the wafers must be placed flat against a carrier of limited area. This limits the total number of wafers which may be processed at one time.

The present invention overcomes the problem of cold wall reactors by allowing a large number of wafers to be processed at the same time without degradation of the quality of the deposited layer. A large number of wafers may be processed at comparatively high temperatures or low temperatures without compromising the uniformity of the deposited layer.

Additionally, reactors using plasma technology have a similar requirement as that of cold wall reactors. The wafers must be placed flat against a carrier or part of a carrier, of limited area. This limits the rate at which semiconductor wafers may be processed.

For reactors used in plasma-enhanced CVD, the present invention provides for a large number of wafers to be processed at once with uniformly deposited layers. The present invention also provides for a high volume plasma etching reactor in which material is removed from the wafers.

SUMMARY OF THE INVENTION

The present invention provides for a carrier for holding semiconductor substrates in a reactor useful in semiconductor wafer processing technology comprising one or more pairs of surfaces. Each pair of surfaces defines a basic cell which makes up the carrier. The two surfaces of the pair are oriented in two non-parallel planes which intersect in a line. The side of each surface facing the other has one or more cavities, recesses, or sets of pins protruding from the surfaces for holding semiconductor substrates adjacent to the surfaces. The surfaces are oriented such that the planes defined by the adjacent faces intersect at an included angle $\alpha$ which is in the range of 1°–60°.

With this configuration, there is a gap between the surfaces which is wider at one end of the surfaces than at the other. The gap width is defined as the minimum dimension between the surfaces in a plane perpendicular to the direction of the gas flow.

Process gas, flowing by forced convection, and flowing perpendicular to the line defined by the intersecting planes enters the space between the plates at its widest point and exits from the space where the gap is most narrow. The narrowing gap accelerates the process gas and aids in compensating for the depletion of material from the gas as it flows.

The carrier may be used for chemical vapor deposition, including plasma-enhanced CVD, and plasma etching.

DESCRIPTION OF THE DRAWINGS

FIG. 1 shows two different kinds of hot wall reactors;

FIG. 2 illustrates three different types of cold wall CVD reactors; and

FIG. 3 shows some useful configurations of the basic carrier cell of the present invention.

FIG. 4 is a cross-section perspective view of a reactor in accordance with the present invention.

FIG. 5 illustrates the geometrical relationships of the basic cell of the reactor in FIG. 4.

DETAILED DESCRIPTION OF SPECIFIC EMBODIMENTS

In a chemical vapor deposition, the rate of deposition and the mechanism of deposition is a function of temperature. At comparatively low temperatures, the deposition rate is limited by the surface reaction rate. The mass transport, or rate of arrival, of the reactant gas species from the gas stream to the reacting surface is faster than the surface reaction rate. The uniformity of the deposited layer formed from the reaction of the gas species is primarily determined by the uniformity in temperature at the substrate surface. A typical example of surface reaction rate limited process is the deposition of polycrystalline silicon at low pressure using $SiH_4$ in the 500°–650° C. temperature range. It is for surface reaction rate limited processes, such as this, that hot wall CVD reactors are particularly suitable.

At higher temperatures, the surface reaction rate can exceed the rate of arrival, or mass transport, of the gas species to the reacting surface. This temperature region of chemical vapor deposition is termed mass transport limited. Here, the uniformity of the deposited layer is determined primarily by the fluid mechanics of the gas flow to the heated surface.

Cold wall CVD reactors are more suited in the mass transport limited reaction region. Cold wall reactors are also satisfactory in the surface reaction rate limited region, but their smaller capacity places them at a disadvantage when compared to the hot wall reactors operating in the lower temperature regions. On the other hand, hot wall reactors may be adapted to operate in the higher temperature region. However, to achieve the same uniformity performance as cold wall systems, the rate of deposition of the material must be slowed substantially so that the productivity advantage of the hot wall system is lost.

In order to deposit uniform layers over large surface areas, all CVD systems have compensatory measures as the reactant gases flow over, react with the heated surfaces and become depleted as the gases flow downstream. In the surface reaction rate limited region, depletion is less a problem when the temperature is uniform because the low surface reaction rate limits the amount of reaction that can take place per unit time at any location. However, even in hot wall LPCVD systems, some form of depletion compensation is made. These include increasing the downstream temperature, injecting reactant gases from two ends of the process enclosure, or providing a gas distribution manifold.

For the higher temperatures and in the mass transport limited region, depletion becomes more important. Compensation is achieved by carrier motion, e.g., see FIGS. 2A and 2C, by increasing temperature downstream, or by tilting the heated carrier relative to the reactor wall to increase the gas velocity and to decrease the distance the reactants must diffuse before they react with the heated surface downstream, e.g., see FIG. 2B.

In any case, the lower temperature, surface reaction rate limited hot wall reactors have a larger load capacity than the cold wall systems. In the hot wall systems, the substrates stand vertically and parallel to each other at relatively close spacing. As pointed out, this increases productivity. On the other hand, the cold wall systems have the substrates flat against the carrier, thus limiting the amount of substrates which may be processed at one time in the CVD reactor and lowering productivity.

However, cold wall reactors have an advantage over hot wall sytems. When substrates lie against the large thermal mass of a carrier, the flow of process gas cannot cool the substrate substantially. Each substrate remains near the proper reaction temperature to avoid crystal damage from excess temperature gradients caused by gas cooling.

The present invention provides for a wafer substrate carrier having basic cells formed by two nonparallel surfaces. Wafers are mounted against each of the surfaces to face the other surface. Being nonparallel, the two surfaces define a cell volume which has a wide end and a narrow, converging end. Process gas flows from the wide end to the narrow end perpendicular to a line formed by the intersection of the two planes coincident with the two surfaces. The basic cells may be arranged in many ways for carriers of different configurations.

The present invention permits a large number of wafers to be processed at one time with the uniformity and other performance advantages of a cold wall system. The surface against which a wafer is mounted is part of a heated carrier/susceptor. Because the wafer also faces another surface and wafer, the temperature profile across and through the wafer is uniform. This ensures uniform processing and processing with a minimum of crystallographic slip in the wafer.

FIG. 3 illustrates some basic forms of the present invention. In FIG. 3A, the basic cell 10 of a wafer substrate carrier includes the wedge-shaped space formed by the surfaces of any two wedge-shaped plates 13. The angle $\alpha$ is the angle formed by the planes containing the surfaces 11A, B of the plates 13 which form the basic cells 10. Substrates 12 lie against the surfaces of the wedge-shaped plates 13 and are heated together with the plates by a combination of radiation, convection, and direct energies by means not shown. The process gas, whose flow is indicated by arrows, moves vertically downward past the faces of the plates 13 and the substrates 12, exiting from each basic cell at its narrowest point where the gap is at least 0.1 inches wide. It is believed that a gap narrower than 0.1 inches requires too great a pressure differential for proper CVD gas flow with standard reactor gas equipment. The process gas is accelerated as it moves from the wider part of the fundamental cell toward the most narrow part to compensate for the depletion of the process gas. The process gas flow 4 is confined within the basic cells 10 by an enclosure 14.

The substrates 12 are held in place against the plates 13 by cavities in the surfaces 11A, B of the plates 13, or by simple pins protruding from the surfaces 11A,B of the plates 13.

FIG. 3B illustrates a top view of a circular configuration of basic cells. The basic cells 20 are formed by pairs of plates 23 with parallel surfaces 21A, B. Substrates 22 are placed against the surfaces 21A, B of the plates 23. Process gas flows from the outer periphery of the circular array toward the inner part and is accelerated as the gap between the surfaces 21A, B of the plates 23 narrows. The narrowest part of the gap in this configuration is 0.1 inches. A surrounding enclosure 24 confines the process gas to the outer periphery before it flows to the center of the configuration. In this circular configuration the angle α is approximately 360° divided by the number of fundamental cells in the circle.

The substrates 22 may be held flat against the plates 23 or held in simple cavities or recesses; however, notched pins 25 or notched recesses are required to keep the wafers 22 from falling out because the wafers on the circular array are balanced vertically. The lower illustration of FIG. 3B show a side cutaway view of a wafer 22 resting on a notched pin 25 against a plate 23.

FIG. 3C and 3D illustrate circular arrays of fundamental cells 20 in which the plates 23 are not constructed with parallel faces. In FIG. 3C, the plates 23 are wedge-shaped with the narrowest part of their wedge facing outward. In FIG. 3D, the plates 23 are wedge-shaped with the narrowest part of their wedge-shape facing inward.

The plates 23 which form the fundamental cells may be heated by any combination of radiation, induction, or convection energy sources. A surrounding wall 24 may be heated to make a hot wall reactor or it may be cooled to make a cold wall reactor. The surrounding wall 24 may be opaque and energy-absorbent or it may be transparent and pass most of the energy radiated from the plates 23 to the environment outside the process chamber. The wall 24 may also provide the seal to exclude the outside environment or it may be an internal element with a separate wall (not shown) providing the seal. The basic forms of the invention illustrated in FIG. 3 all utilize the thermal mass of the plates against which the wafers rest to provide a uniform wafer temperature in spite of the cooling effect of the flowing gas. This invention may be extended to include lower temperature, hot wall, low pressure chemical vapor deposition (LPCVP) type reactions by simply operating in those regions.

Alternatively, because LPCVD type reactions do not require a thermal mass to maintain wafer temperature, the thermal mass of the plates illustrated in FIG. 3 may be eliminated for such process regimes. In such a system, the carrier would consist of a simple lattice structure to support the wafers in their same relative positions as they are if FIG. 3. In this case, the faces of the wafers become the surfaces that form the basic tapered cell.

FIG. 4 is a cross-section perspective view of a specific embodiment of the present invention. The process enclosure is defined by a base 40 and a wall 34, which is joined to the base 40 by an airtight seal 41 during operation. A carrier 30 of circularly arranged carrier plates 33 holds the wafers 32 during a CVD process. Heating of the carrier 30 is performed by upper and lower resistive heaters 39A,B. These heaters may also be provided with optional heat shields 53, 54. These heat shields 53, 54 help maintain heat in the region of the carrier 30.

Over the lower heater 39B is a flow director 37 in the shape of an inverted cone upon which the carrier plates 33 rest. The cone 37 rotates so that the plates 33 and the accompanying wafers 32 also move around the center axis of the carrier. The cone-shaped director 37 is part of a central shaft 49 which has a flange 51. The flange 51 rests on bearings 43 so that the shaft 49 is capable of rotation. A driving pinion 44 engaging a ring gear 45 fixed to the flange 51 rotates the shaft 49 and director 37. A simple friction drive may also be used. Above the plates 33 and below the upper heater 39A is an upper cone-shaped flow director 38 which is parallel to the lower flow director 37. The upper flow director 38 remains stationary and, together with the lower flow director 37, helps maintain the direction of gas flow through each cell of the carrier in the desired direction.

The reactant gases are directed from the open end of the plates 33 to the inner, converging end of the plates between heated cones 37, 38. To be more precise, the gas is directed from the open to the converging end substantially perpendicular to the line formed by the intersecting planes coincident with the two surfaces of each basic cell. This geometry forces the gases to increase velocity as they move toward the converging end of the plates 33. As a result of the increasing velocity, the distance the reactant in the gas must diffuse to the wafer 32 decreases downstream so that gas depletion is compensated for.

Gas flow is directed from gas inlets 52 connected to a source of gas (not shown) through gas distribution manifolds 43 located along the enclosure wall 34. From four to nine manifolds 43 are evenly distributed about the carrier 30. Other arrangements are possible, as long as fresh gas is delivered evenly to the rotating wafers. After passing through the fundamental cells of the carrier 30, the gases reach a gas exhaust located at the center of the carrier 30. The exhaust has multiple concentric pipes 47, 48 and a hollow central shaft which lead to an exhaust chamber 50 from which the gases are removed by an exhaust pipe 46. The pipes 47, 48 and shaft 49 are uneven in length so as to draw gases evenly along the height of the carrier plates 33.

The geometry of the carrier 30 permits a large number of wafers 32 to be placed flat against a carrier to be processed at one time for high productivity with good uniformity in the deposited layer. The carrier 30 is comprised of 25 graphite carrier plates 33 arranged in a ring about the center of the process enclosure. The plates 33 are removable for maintenance and the wafers 32 may also be easily inserted and removed from the plates 33 without removing the plates. The plates 33 engage slots 36 in the central shaft 49 and lower flow director 37 to secure them in place. The plates 33 are substantially vertical and oriented so that the planes in which each set of opposing surfaces 31A,B of the plates 33 lie intersect at an angle α. This angle may be in the range of 1 to 60 degrees; in the embodiment shown in FIG. 4, α is approximately 13.2 degrees.

The wafers 32 are mounted in cavities 35 in each plate 33. It is understood that one or more cavities can be made in the faces of each plate. The wafer or wafers 32 on one plate 33 typically faces a wafer or wafers on a neighboring plate. This geometry permits each wafer 32 on its heated plate 33 to face another heated plate 33 to ensure temperature uniformity across the wafer 32 and through its thickness. Cold wall reactors in the prior art had wafers radiating energy toward the cooler walls of the system. The present invention has the opposing plate ensuring temperature uniformity.

A heating variation may be the inclusion of heating lamps around the enclosed wall 34. With the wall 34 made of transparent quartz, radiation from the lamps may penetrate the wall 34 to heat the carrier 30. In combination with the heating elements 37, 38, the lamps can compensate for heat loss through the wall 34 to ensure temperature uniformity and uniformity in the deposited material on the wafers 32.

FIG. 5 illustrates the orientation of the carrier cells in the reactor of FIG. 4 in greater detail. The cells are arranged circularly as discussed with respect to FIG. 3. The angle $\alpha$ remains the angle between the planes coincident with the surfaces of the plates 33 which define each cell. But each cell is tilted by an angle $\beta$ from the vertical. The lines formed by the planar intersections of the plate surfaces are thus tilted away from the vertical by the angle $\beta$, which may range from 0° to 90°. In the embodiment of FIG. 4, $\beta$ is approximately 22 degrees.

The gas is directed to flow from the widest to the narrowest gap of each cell and flows substantially perpendicular to the line formed by the intersecting planes of the plate surfaces of each cell. As shown in FIG. 5B, which is a cross-sectional view along the line 5B—5B in FIG. 5A, the distance between the plate surfaces perpendicular to the gas flow direction is a constant. As one proceeds along the gas flow direction, the gap narrows until the end of the plates 33 are reached at which the gap is narrowest. In the embodiment of FIG. 4, this narrowest gap is approximately 0.4 inches. It is believed that for most CVD, plasma-enhanced CVD, and plasma etch purposes, the narrowest gap should be greater than 0.1 inches.

FIG. 5C is a cross-sectional view along the line 5C—5C in FIG. 5A. Line 5C—5C represents a vertical plane through the plates. As seen in FIG. 5C the plate surfaces are inclined away from the vertical by angle $\phi$. This permits the substrates 32 to be held in place in the cavities 35 by gravity. There is no need for notched pins which could be used to secure the substrates 32 against vertical surfaces.

The angles $\alpha$, $\beta$, and $\phi$ are related to each other by the equation:

$$\tan \phi = \tan \alpha/2 \sin \beta.$$

For the values of $\alpha$ and $\beta$ given for the reactor shown in FIG. 4, $\phi$ is approximately 2.5 degrees. Of course, small protrusions from the plates 33 may also be used in place of cavities to mount the wafers 32. No change in the reactor operation is required. However, it has been found that using cavities or pockets to receive the wafers reduces crystal damage around the region of contact with the wafer. Protrusions, such as pins, with their narrow region of contact, seem to make crystal damage more likely.

Having defined the basic cell of the carrier 30, the plates 33 are shaped accordingly. Hence, the plates 33 in FIG. 4 are necessarily wedge-shaped with the thicker part of the plate 33 at the bottom. The plates 33 are also unitary with two sides of a plate 33 presenting one surface 31A or 31B to two adjacent basic carrier cells. Instead of a solid single plate 33, it is possible to have the region between the surfaces 31A, B hollowed out. This reduces the plates' weight for ease of transport and reduces the plates' thermal mass to quicken the heating and cooling of the plate and accompanying wafer. It is also possible to use two plates in place of a unitary plate 33, each of the two plates bearing one surface 31A or 31B of a basic cell. These plates may be wedge-shaped or may be flat plates with a space between them. The plates need not be of a simple wedge-shape, but may also be constructed such that the thickness of the plate at each corner has a different value.

Besides graphite, silicon carbide-coated graphite may be used as a material for the plates of this invention. Aluminum or coated aluminum may also be used, especially for the plasma enhanced reactors, discussed immediately below.

Because the wafers rest against the plate, whether secured by pins or a cavity, plasma techniques are also readily adaptable to the present invention. Plasma energy may be used with any configuration of the fundamental cells to enhance the CVD process by making the plates an electrode or a ground point. Neighboring plates may be charged with opposite polarity, in a DC or AC manner, to create a plasma between any two facing plates.

Other arrangements include the combination of the plates in configurations discussed above as electrodes of one polarity and separate electrodes of opposite polarity. Such separate electrodes might be located around the carrier formed by the plates, or located separately in the periphery of the carrier, or even located within the space of each basic tapered cell.

The present invention permits a large number of wafers to be processed in one plasma-enhanced CVD step. Due to the uniform heating of the wafers and the process gas flow through each basic carrier cell, material is deposited uniformly on the wafers.

Furthermore, plasma may be used to etch the wafers carried by the plates. By the appropriate selection of process gases and plate materials, and by the application of voltages to the carrier plates, material is removed from the wafers. The uniformity in temperature and acceleration of the gas through the basic tapered cells permit uniform plasma etching of the wafers.

Although the foregoing invention has been described in some detail by way of illustration and examples for purposes of clarity and understanding, it will be obvious that certain changes and modifications may be practiced within the scope of the appended claims.

What is claimed is:

1. A chemical vapor deposition reactor comprising
   a carrier having a plurality of cells arranged in a circle around a center, each cell having a pair of opposing flat surfaces with means for mounting substrates thereto, said surfaces oriented in two non-parallel planes intersecting in a line so as to form a first angle $\alpha$ with each other at said intersecting line, said intersecting line forming a second angle $\beta$ with respect to the vertical;
   a pair of gas flow directors, a first director located below said carrier and a second director located above said carrier to maintain any gas flow through said carrier;
   an inlet means for introducing gas around the periphery of said carrier; and
   an exhaust means for removing gas from said center of said plurality of carrier cells;
   whereby gas flows through each cell in a direction substantially perpendicular to said intersecting line.

2. A reactor as in claim 1, wherein said first and second flow directors comprise substantially parallel, cone-shaped surfaces having their axis through said carrier center.

3. A reactor as in claim 2, further comprising
   first heating means located below said first gas flow director and second heating means located above said second gas flow director, whereby said substrates in said carrier cells are heated substantially uniformly.

4. A reactor as in claim 3, further comprising third heating means located around the periphery of said carrier for radiantly heating said carrier.

5. A reactor as in claim 1, wherein said carrier rotates with respect to said inlet means when said reactor is in operation.

6. A reactor as in claim 5, wherein said carrier cell surfaces rest upon said first gas flow director, said first gas flow director being rotated by a drive means when said reactor is in operation.

7. A reactor as in claim 1, wherein said carrier surfaces comprises removable plates.

8. A reactor as in claim 7, wherein said mounting means comprises pockets or pins in said plates.

9. A reactor as in claim 8, wherein adjoining surfaces of two adjacent cells comprise a unitary plate of solid construction.

10. A reactor as in claim 8, wherein adjoining surfaces of two adjacent cells comprise a unitary plate of hollowed out construction.

11. A reactor as in claim 8, wherein adjoining surfaces of two adjacent cells comprise two separate plates.

12. A semiconductor wafer processing reactor having a carrier and a means for introducing process gas, said carrier comprising:
a plurality of cells, each cell having a pair of reciprocally facing flat surfaces having means for mounting substrates thereto, said surfaces separated in two nonparallel planes which intersect in a line, and defining an open end and a converging end,
said cells arranged in a circle, said open ends of said cells on the outside of said circle and said converging ends on the inside of said circle, said intersecting line of each cell oriented in a generally vertical direction,
said cells tilted so that said intersecting line of each cell forms an angle with respect to the vertical, whereby said substrates are held against said surfaces by gravity, and
said gas introducing means arranged with respect to said carrier so that each carrier cell receives process gas at said open end for a gas flow between said surfaces to said converging end in a direction substantially perpendicular to said line.

13. A semiconductor wafer processing reactor as in claim 12 further comprising a pair of gas flow directors, a first director located below said carrier and a second director located above said carrier to maintain any gas flow through said carrier.

14. A semiconductor wafer processing reactor as in claim 13 wherein said first and second flow directors comprise substantially parallel, cone-shaped surfaces having their axes through said carrier center.

15. A semiconductor wafer processing reactor as in claim 13 further comprising first heating means located below said first gas flow director and second heating means located above said second gas flow director, whereby substrates in said carrier cells are heated substantially uniformly.

16. A reactor as claim 15 further comprising third heating means located around the periphery of said carrier for radiantly heating said carrier.

17. A reactor as claim 13 wherein said carrier rests upon said first gas flow director, said first gas flow director being rotated by a drive means when said reactor is in operation.

18. A semiconductor wafer processing reactor having a carrier and a means for introducing process gas, said carrier comprising:
a plurality of cells, each cell having a pair of reciprocally facing flat surfaces having means for mounting substrates thereto, said surfaces separated in two nonparallel planes which intersect in a line, and defining an open end and a converging end,
said cells arranged in a circle, said open ends of said cells on the outside of said circle and said converging ends on the inside of said circle, said intersecting line of each cell oriented in a generally vertical direction,
said cells tilted so that said intersecting line of each cell forms an angle with respect to the vertical, whereby said substrates are held against said surfaces by gravity, and
said gas introducing means arranged with respect to said carrier so that each carrier cell receives process gas at said open end for a gas flow between said surfaces to said converging end.

19. A semiconductor wafer processing reactor as in claim 18 further comprising a pair of gas flow directors, a first director located below said carrier and a second director located above said carrier to maintain any gas flow through said carrier.

20. A semiconductor wafer processing reactor as in claim 19 wherein said first and second flow directors comprise substantially parallel, cone-shaped surfaces having their axes through said carrier center.

21. A semiconductor wafer processing reactor as in claim 19 further comprising first heating means located below said first gas flow director and second heating means located above said second gas flow director, whereby substrates in said carrier cells are heated substantially uniformly.

22. A reactor as claim 21 further comprising third heating means located around the periphery of said carrier for radiantly heating said carrier.

23. A reactor as claim 19 wherein said carrier rests upon said first gas flow director, said first gas flow director being rotated by a drive means when said reactor is in operation.

24. A carrier for a semiconductor wafer processing reactor, said carrier comprising:
a plurality of circularly arranged upright plates, said plates having pairs of reciprocally facing flat surfaces, said flat surfaces having means for mounting wafers thereto, each surface pair separated in two nonparallel planes intersecting in a line, and defining a cell therebetween, said cell and said intersecting line forming a pie-slice configuration,
said plates tilted so that said intersecting line of each surface pair and cell forms an angle with respect to the vertical, whereby said substrates are held against said surfaces by gravity and said pie-slice configuration of each cell and intersecting line is maintained.

* * * * *